United States Patent

Ariyoshi

[11] Patent Number: 5,841,183
[45] Date of Patent: *Nov. 24, 1998

[54] CHIP RESISTOR HAVING INSULATING BODY WITH A CONTINUOUS RESISTANCE LAYER AND SEMICONDUCTOR DEVICE

[75] Inventor: Shogo Ariyoshi, Itami, Japan

[73] Assignee: Mitsubishi Denki Kabushiki Kaisha, Toyko, Japan

[*] Notice: This patent issued on a continued prosecution application filed under 37 CFR 1.53(d), and is subject to the twenty year patent term provisions of 35 U.S.C. 154(a)(2).

[21] Appl. No.: 79,735

[22] Filed: Jun. 22, 1993

[30] Foreign Application Priority Data

Jun. 23, 1992 [JP] Japan ...................... 4-165006

[51] Int. Cl.$^6$ .................................................. H01L 29/00
[52] U.S. Cl. ...................... 257/536; 257/724; 338/324; 338/333
[58] Field of Search ....................... 257/516, 536, 257/724; 338/203, 204, 205, 275, 308, 309, 315, 318, 333, 324

[56] References Cited

U.S. PATENT DOCUMENTS 4,831,432 5/1989 Hori et al. .............................. 338/309
4,924,205 5/1990 Caporali et al. ........................ 338/203

FOREIGN PATENT DOCUMENTS 5914602 1/1984 Japan ...................................... 338/204
2128813 5/1984 United Kingdom ................... 338/204

OTHER PUBLICATIONS

IBM Tech. Disc. Bulletin, (Krolikowski) vol. 12, No. 11; Apr. 1970.

Primary Examiner—Olik Chaudhuri
Assistant Examiner—Nathan K. Kelley
Attorney, Agent, or Firm—Leydig, Voit & Mayer

[57] ABSTRACT

A chip resistor includes a resistor body, a wire-bonding electrode, and a soldering electrode respectively disposed on a first major surface and a second major surface of the resistor. Two electrodes are electrically connected to each other only through the resistor body. The resistor body includes an insulating substrate having a resistance layer printed on both its major surfaces and one of its side surfaces. The resistor body may include a semiconductor material. A semiconductor device having the chip resistor in which a wire from an electronic component is directly bonded to the wire-bonding electrode of the chip resistor is also disclosed.

3 Claims, 9 Drawing Sheets

CHIP RESISTOR HAVING INSULATING BODY WITH A CONTINUOUS RESISTANCE LAYER AND SEMICONDUCTOR DEVICE

BACKGROUND OF THE INVENTION

This invention relates to a chip resistor and, more particularly, to a chip resistor suitable for mounting on a lead frame of a semiconductor device, and also to a semiconductor device using such a chip resistor.

Figure 11:
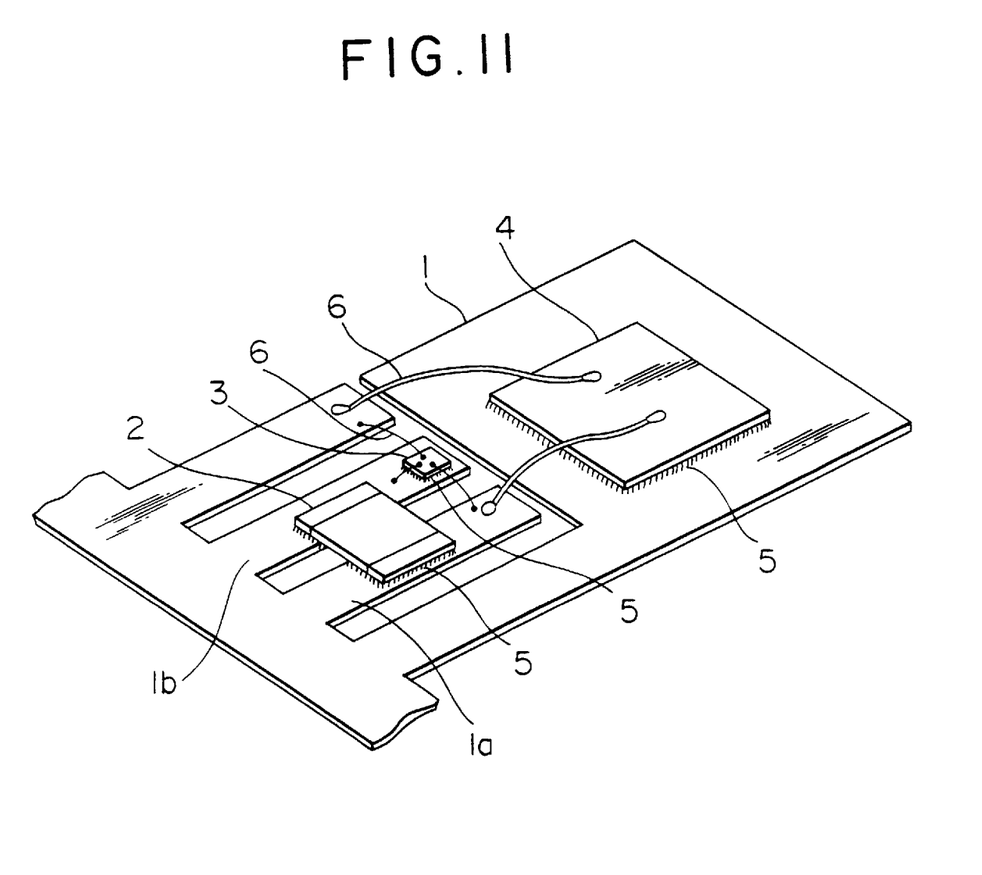
FIG. 11 is a perspective view of a conventional semiconductor device having mounted thereon a conventional chip resistor.

FIG. 11 illustrates one example of a conventional chip resistor and a structure of a conventional semiconductor device having the chip resistor on its lead frame. In FIG. 11, the semiconductor device comprises a lead frame 1 which is stamped out from a metal plate of such as copper, iron or an alloy of iron and nickel, and whose surface is plated with nickel or silver to improve solderability or wire-bonding ability. In this example, a chip resistor 2, an integrated circuit (IC) chip 3 and a semiconductor chip such as a transistor 4 are mounted on the lead frame 1 and a condenser and the like may be generally mounted thereon. Since the chip resistor 2 has electrodes at both its ends, it is bridgingly disposed between two leads 1a and 1b of the lead frame 1. A solder connection or a solder 5 secures electronic components such as the chip resistor 2 to the lead frame 1. Instead, a conductive resin may be used for bonding. When the chip resistor 2 is being fixed on the leads, an undesirable stress arises at the solder connections because of the difference between coefficients of thermal expansion of the chip resistor 2 and the lead frame 1. 6 designates a wire which is made of gold or aluminium.

Figure 12:
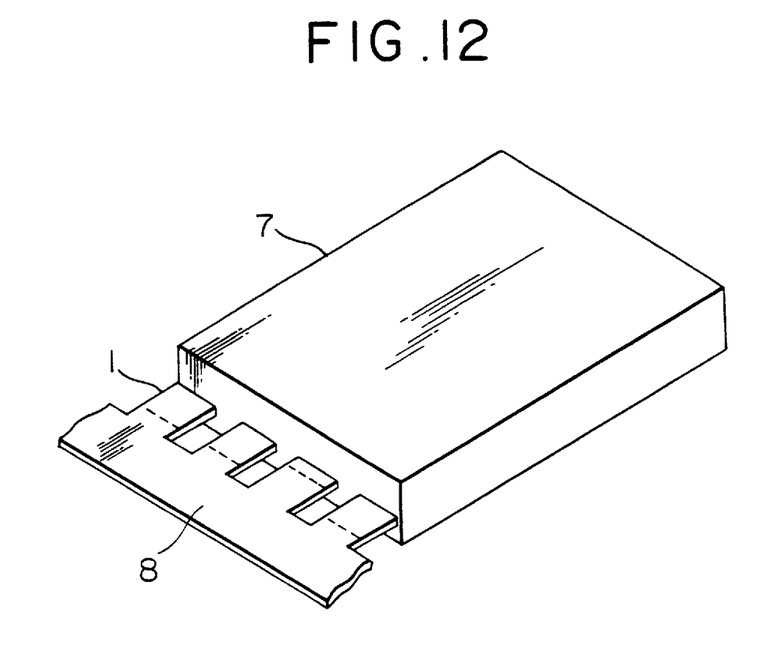
FIG. 12 is a perspective view of the semiconductor device of FIG. 11 sealed with a mold resin.

As illustrated in FIG. 12, a semiconductor device shown in FIG. 11 is sealingly covered with a package 7 made of a molding resin such as an epoxy resin to protect the semiconductor device mechanically and environmentally. In the molding operation, the resin which is softened by heating is injected into a mold die (not shown) to encapsulate the semiconductor device therein and is taken out from the mold die after cooled. During this heating and cooling process, an undesirable stress caused by the difference between coefficients of thermal expansion of the package 7 and the lead frame 1 is applied to the electronic components on the lead frame 1. After molding, a support portion 8 of the lead frame 1 or a tie bar is cut off along a broken line in FIG. 12 and making the leads of the lead frame 1 independent, so that the electrical property of the semiconductor device can be tested. When the tie bar is cut off by a pressing die (not shown), an undesirable stress is transmitted from the leads to the electronic components.

Figure 13:
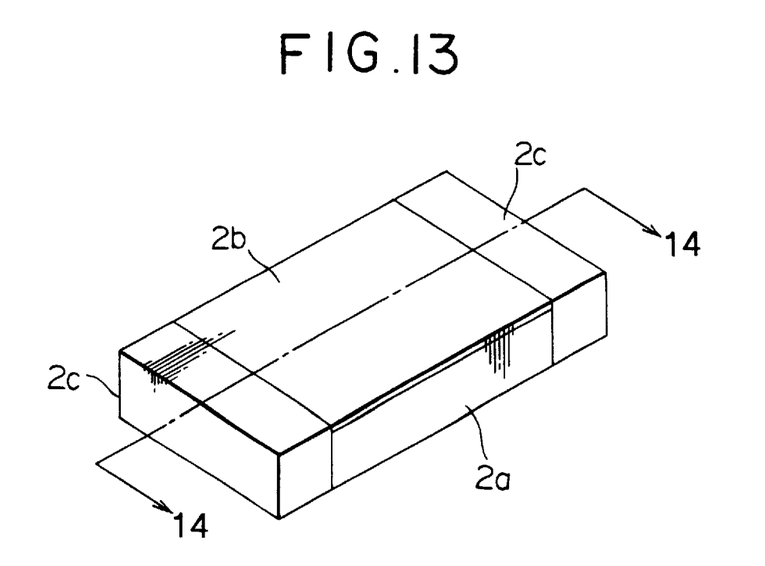
FIG. 13 is a perspective view of a conventional chip resistor.
Figure 14:
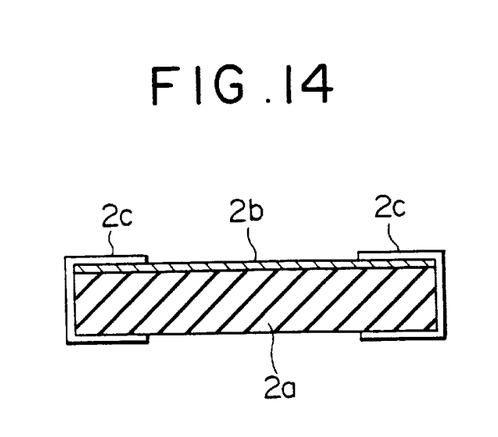
FIG. 14 is a longitudinal sectional view taken along line 14—14 of FIG. 13.

One example of a structure of a conventional chip resistor is illustrated in FIG. 13. FIG. 14 is a longitudinal sectional view taken along line 14—14 in FIG. 13. 2a designates an insulating substrate such as a ceramic. A resistance layer 2b in the form of a film is disposed on the upper surface of the insulating substrate 2a. The resistance layer 2b is formed by printing and baking a paste of a resistance material such as ruthenium oxide on the upper surface of the insulating substrate 2a by a suitable printing method. Two electrodes 2c made of a solderable metal such as nickel are attached to and cover opposite ends of the insulating substrate 2a and the resistance layer 2b so that the electrodes 2c are electrically connected to each other through the resistance layer 2b and the overlapping portions between each one of the electrodes 2c and the resistance layer 2b. The electrodes 2c are formed by dipping the ends of the insulating substrate 2a in a paste of a solderable metal material and by baking the paste.

Figure 15:
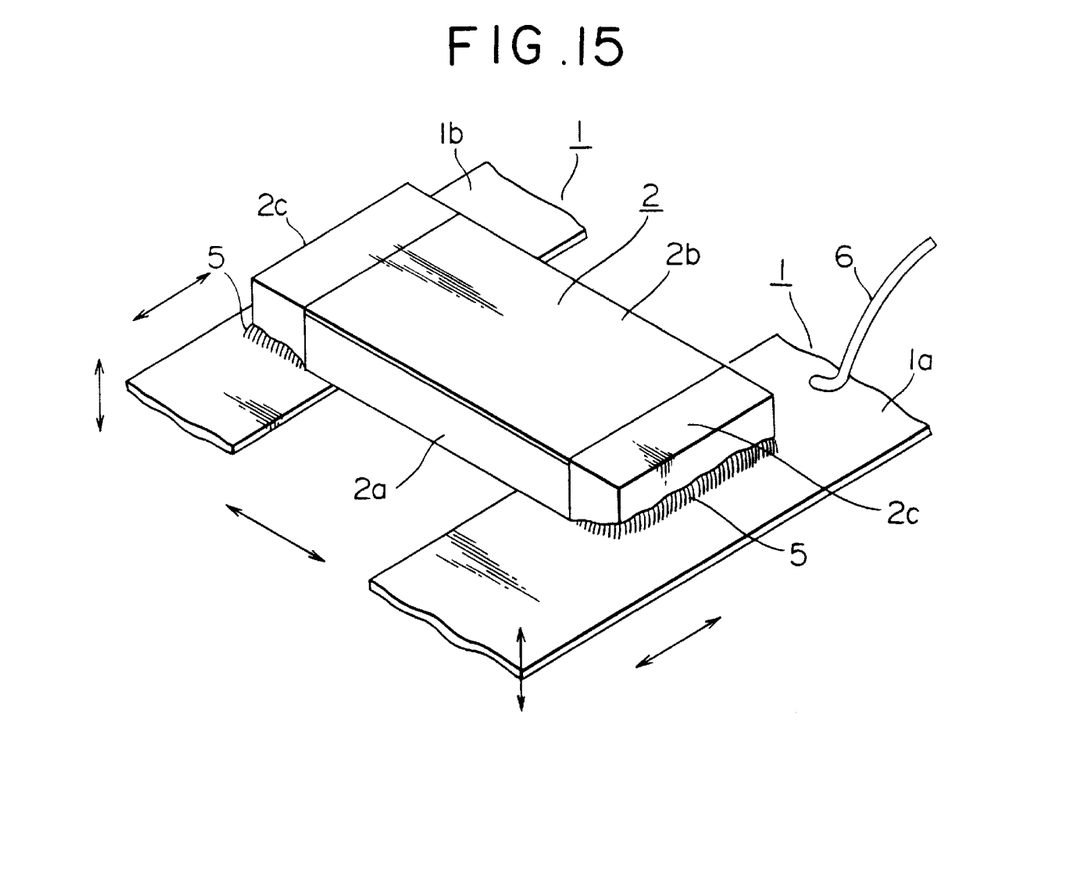
FIG. 15 is a perspective view of the conventional chip resistor of FIG. 13 mounted on a lead frame.

FIG. 15 illustrates the undesirable stresses which are generated due to soldering heat when the chip resistor 2 is mounted on the lead frame 1 with the solder 5 or which are generated during the molding and the tie bar cutting. As illustrated in FIG. 15, the stresses such as tension, compression and shear shown by arrows are applied to the solder connections 5 between the chip resistor 2 and each of the leads 1a and 1b. The chip resistor 2 is bridgingly secured across two leads 1a and 1b and is electrically connected to the two leads 1a and 1b by the solder connections 5 which are electrical connection portions of comparatively small area. A wire 6 from the transistor 4 is connected to the lead 1a.

The conventional chip resistor 2 is constructed as described above and it is mounted across two leads 1a and 1b at two points, so it is apt to be influenced during assembly of the semiconductor device by the undesirable stresses which are generated during the tie-bar cutting or due to the difference between coefficients of the thermal expansion of the chip resistor 2 and the lead frame 1. Therefore, the solder connections 5 and the chip resistor 2 might happen to be damaged and electrically degraded, leading to a problem of reliability. Also, since the lead frame 1 having a complex configuration is needed, it is expensive Further, an electric current path extending from the wire 6 connected to another electronic component such as the transistor 4 (FIG. 11) extends from one lead 1a to the other lead 1b through the solder connection 5, the electrode 2c, the resistance layer 2b, the other electrode 2c and the other solder connection 5, which includes many connections, resulting in poor reliability.

SUMMARY OF THE INVENTION

Accordingly, one object of the present invention is to provide a chip resistor free from the above-discussed problems of the conventional chip resistor.

Another object of the present invention is to provide a chip resistor which is resistant to stresses and highly reliable and which allows a reliable, inexpensive electronic device to be obtained without the need for a lead frame of a complex shape.

A further object of the present invention is to provide a semiconductor device which has the above chip resistor mounted thereon and which is reliable, easy to manufacture and inexpensive.

With the above objects in view, the chip resistor of the present invention comprises a resistor body, a wire-bonding electrode attached to the first major surface of the resistor body and a soldering electrode attached to the entire surface of the second major surface of the resistor body. The wire-bonding electrode is electrically connected to the soldering electrode only through the resistor body.

The resistor body may comprise an insulating substrate and a resistance layer attached to major surfaces and a side surface of the insulating substrate. The resistance layer is electrically connected to both the wire-bonding electrode and the soldering electrode.

The wire-bonding electrode may comprise a bonding pad and a soldering material layer for connecting the bonding pad to the resistance layer.

The resistor body may include a semiconductor material having a specific resistance. A wire-bonding electrode is attached to the first major surface of the resistor body and a soldering electrode is attached to the entire surface of the second major surface. The wire-bonding electrode is electrically connected to the soldering electrode only through the resistor body.

In a semiconductor device of the present invention, a chip resistor and other electronic components are mounted on a lead frame. The chip resistor comprises a resistor body, a wire-bonding electrode attached to the first major surface of the resistor body and a soldering electrode attached to the entire surface of the second major surface. The wire-bonding electrode is electrically connected to the soldering electrode only through the resistor body. The chip resistor is attached and electrically connected to a lead of the lead frame with the entire second major surface. A wire from the electron-c component to the chip resistor is directly bonded to the wire-bonding electrode of the chip resistor.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
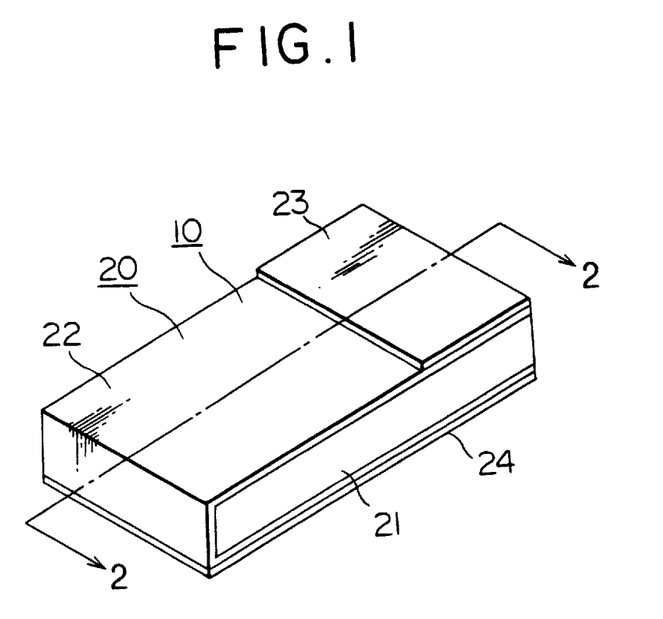
FIG. 1 is a perspective view of an embodiment of the chip resistor of the present invention.
Figure 2:
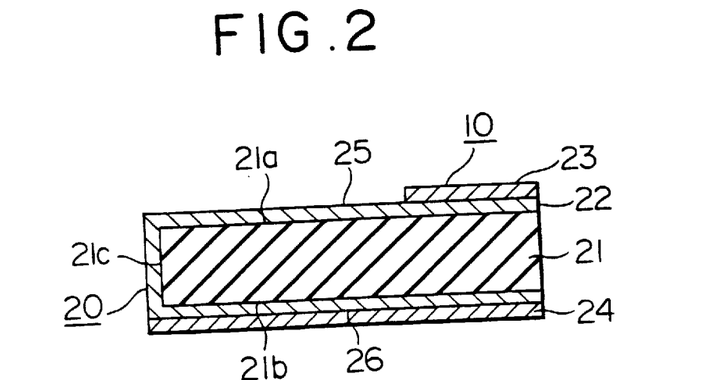
FIG. 2 is a longitudinal sectional view taken along line 2—2 of FIG. 1.

FIG. 1 illustrates a structure of a chip resistor of the present invention and FIG. 2 is a longitudinal sectional view taken along line 2—2 of FIG. 1. The chip resistor 10 of the present invention comprises a resistor body 20 which has a rectangular parallelepiped shape and has first and second major surfaces 25 and 26 and side surfaces. The resistor body 20 comprises an insulating substrate 21 such as a ceramic and a resistance layer 22 such as a ruthenium oxide which is printed on and fixed to both major surfaces 21a and 21b and a side surface 21c of the insulating substrate 21. A wire-bonding electrode 23 or a bonding pad which is made of a metal suitable for a wire-bonding is attached by plating to an end part of the first major surface 25 of the resistor plate 20, which is remote from the side surface 21c. If an aluminium wire is used, aluminum or nickel is appropriate for the wire-bonding electrode 23, and, if a gold wire is used, silver is appropriate for it. A soldering electrode 24 which is suitable for soldering is printed and fixed to the entire second surface 26 of the resistor plate 20. Silver, nickel or an alloy of silver and palladium is, for example, used for the soldering electrode 24. The soldering electrode 24 is electrically connected to the wire-bonding electrode 23 only through the resistor body 20. The resistance layer 22 and the soldering electrode 24 are formed by the printing method and the wire-bonding electrode 23 is formed by plating, so that the assembly of the chip resistor 10 is simple. Further, both the wire-bonding electrode 23 and the soldering electrode 24 are connected to the resistance layer 22 over a relatively large area, so the connection therebetween is strong against stresses.

Figure 3:
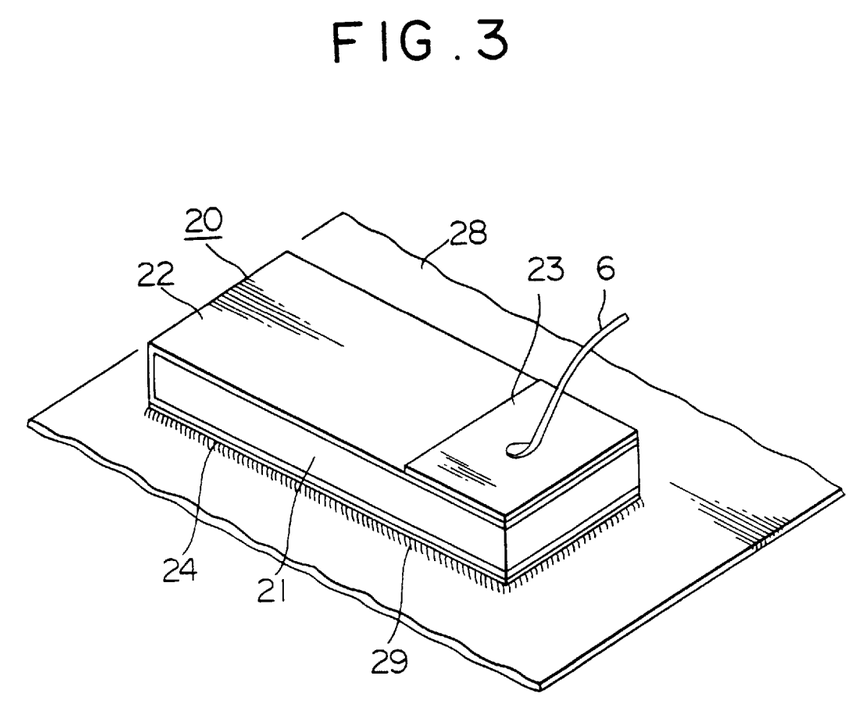
FIG. 3 is an enlarged perspective view of the chip resistor of FIG. 1 mounted on a lead of a lead frame.
Figure 4:
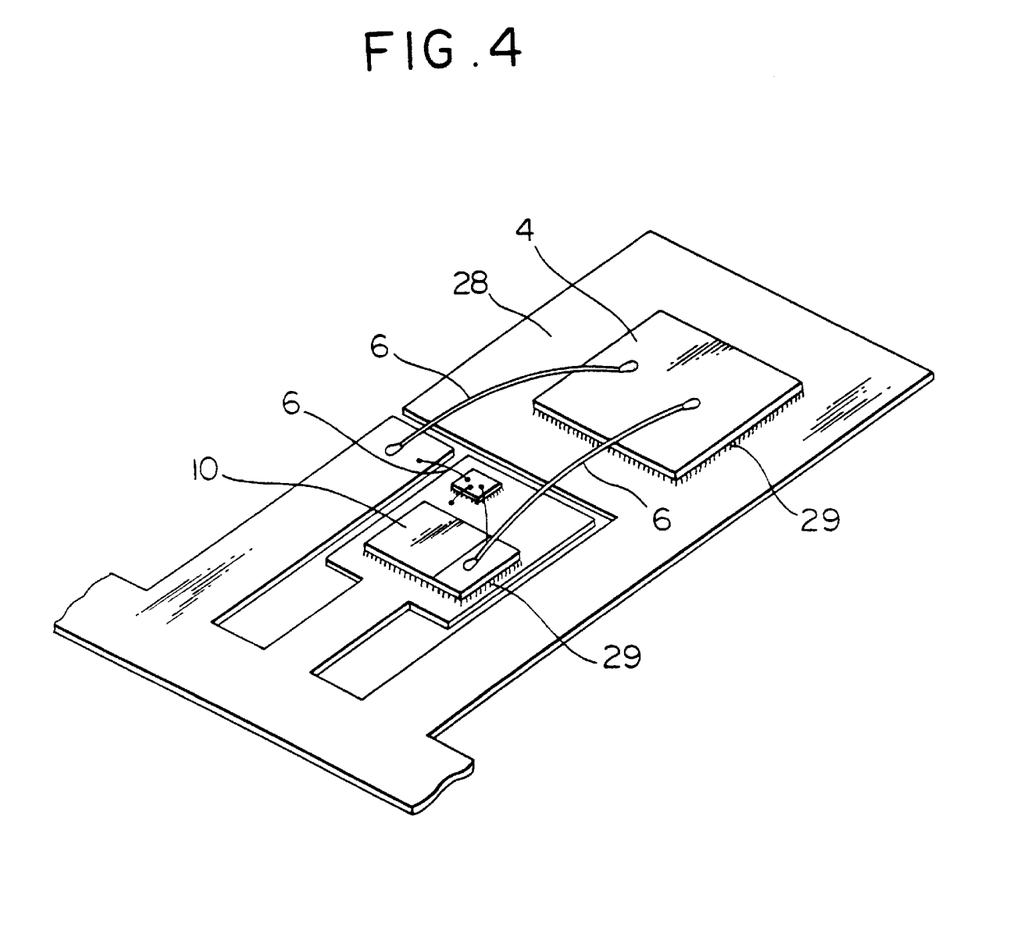
FIG. 4 is a perspective view of the semiconductor device of the present invention in which the chip resistor of FIG. 1 is mounted.

As illustrated in FIG. 3, the chip resistor may be fixed by a solder 29 on a lead frame 28 as a semiconductor device illustrated in FIG. 4. A wire 6 is bonded to the wire-bonding electrode 23. In this structure, as previously described, the soldering electrode 24 is attached to the second major surface wall 26 of the resistor body 20 and the wire-bonding electrode 23 is attached to the first major surface wall 25 and two electrodes 23 and 24 are electrically connected only through the resistor plate 20. The lead frame 28, therefore, need not be formed to make a resistance circuit using the leads, so that the configuration of the lead frame 28 is simple as illustrated in FIG. 4, the rigidity of the lead frame 28 is increased, and costs are reduced. The lead frame 28 is resistant to the stresses caused by the heating, cooling and tiebar-cutting processes during the production of the semiconductor device and the stresses which are added to the chip resistor 10 are decreased. Further, since the chip resistor 10 is firmly attached at one entire major surface to the lead frame 28, the chip resistor 10 is less affected as compared to the conventional design, by the distortion and the deformation of the solder connection between the chip resistor 10 and the lead frame 28 caused by the difference between their coefficients of thermal expansion during the molding and the soldering operations. Also the reliability of the semiconductor device including the chip resistor 10 is improved.

Figure 5:
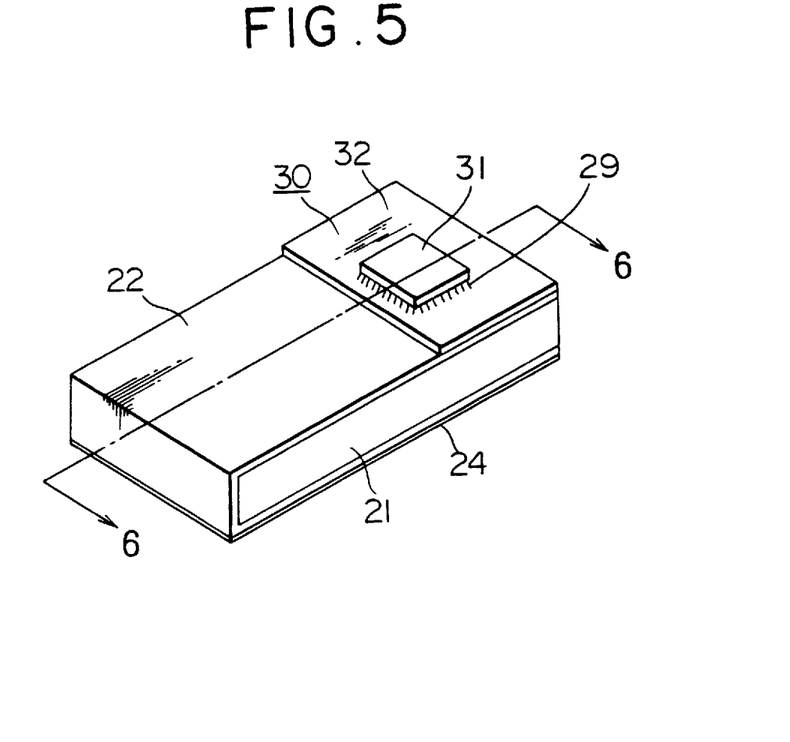
FIG. 5 is a perspective view of another embodiment of the chip resistor of the present invention.
Figure 6:
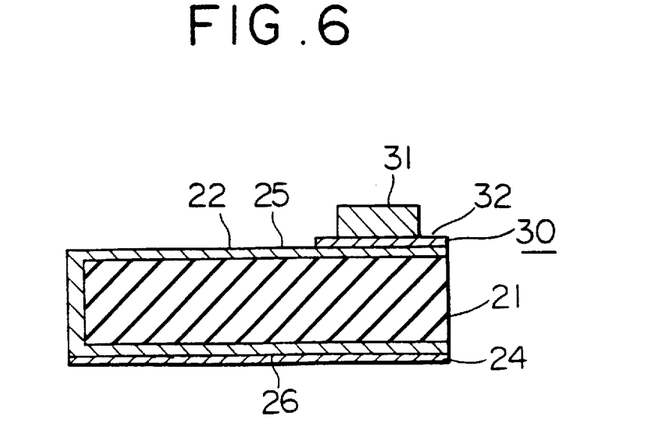
FIG. 6 is a longitudinal sectional view taken along line 6—6 of FIG. 5.
Figure 7:
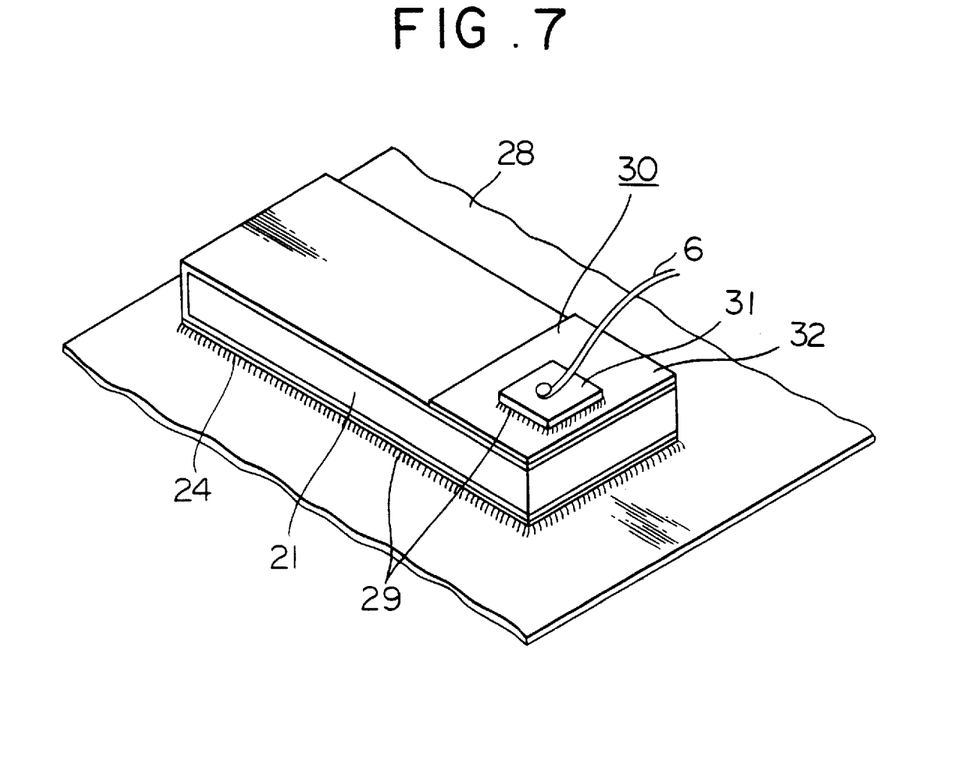
FIG. 7 is a perspective view of the chip resistor of FIGS. 5 and 6 mounted on a lead of a lead frame.

FIG. 5 illustrates another embodiment of the chip resistor of the present invention and FIG. 6 is a longitudinal view taken in the line of 6—6 of FIG. 5, which has basically the same structure as that illustrated in FIG. 1 and FIG. 2 but is different in that the wire-bonding electrode 30 comprises a bonding pad 31, which is a comparatively thick block, and a soldering material layer 32, connecting the bonding pad 31 to the resistance layer 22. The soldering material layer 32 is printed on the resistance layer 22, and for it, silver, nickel or an alloy of silver and palladium is, for example, used. On the soldering material layer 32, the bonding pad 31 is fixed by a solder 29. By using the relatively thick bonding pad 31, a wire can be securely bonded. FIG. 7 is a perspective view of the chip resistor of FIG. 5 mounted on the lead of a lead frame.

Figure 8:
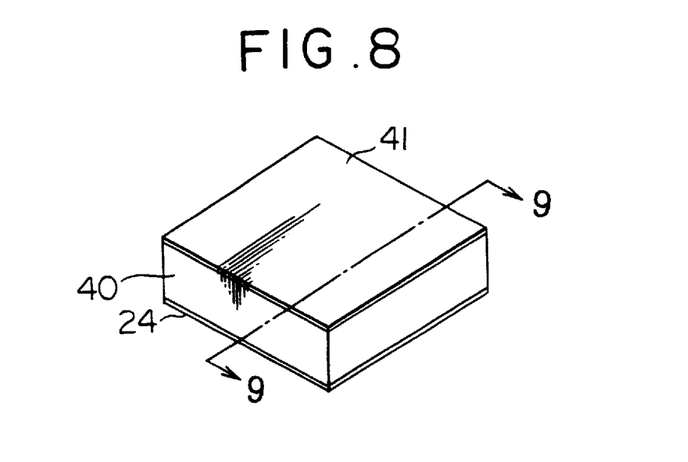
FIG. 8 is a perspective view of still another embodiment of the chip resistor of the present invention.
Figure 9:
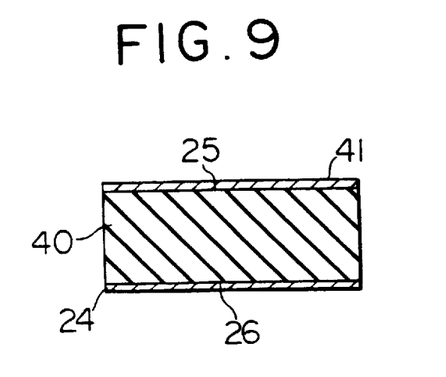
FIG. 9 is a longitudinal sectional view taken along line 9—9 of FIG. 8.
Figure 10:
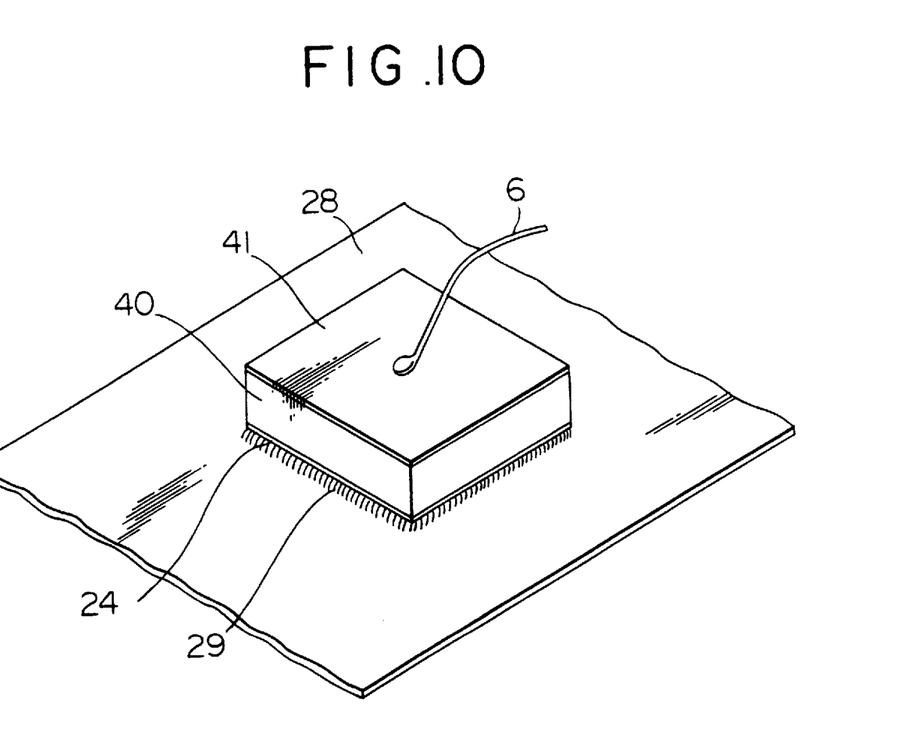
FIG. 10 is a perspective view of the chip resistor of FIGS. 8 and 9 mounted on a lead of a lead frame.

FIGS. 8 and 9 illustrate still another embodiment of the chip resistor of the present invention in which the resistor plate 40 is made of a semiconductor material block having a specific resistance. For a semiconductor material, silicon semiconductor material with impurities such as boron therein is appropriate and the specific resistance can be changed by the concentration of the impurities or by changing the cross sectional area and the height (i.e., thickness) of the resistor plate 40. A wire-bonding electrode 41 is formed on the first major surface 25 of the resistor plate 40 and the soldering electrode 24 is formed on the second major surface by the same method as mentioned in the previous embodiments. This embodiment has a very simple structure and is suitable for a chip resistor having a low resistance. FIG. 10 is a perspective view of the chip resistor of FIG. 8 mounted on a lead of a lead frame 28.

What is claimed is:

1. A chip resistor comprising:

a resistor body comprising an insulating substrate having first and second opposed major surfaces and side surfaces smaller in area than the first and second major surfaces and joining the first and second major surfaces;

a continuous resistance layer disposed on the first and second major surfaces and on at least one of the side surfaces of the insulating substrate;

a wire-bonding electrode for attachment of a wire by wire bonding, the wire-bonding electrode being disposed on and directly contacting the resistance layer at the first major surface of the insulating substrate; and a soldering electrode for soldering to a metallic body, the soldering electrode being disposed on and directly contacting the resistance layer opposite all of the second major surface of the insulating substrate.

2. The chip resistor of claim 1 wherein the wire bonding electrode is one of aluminum, nickel, and silver and the soldering electrode is one of silver, nickel, and an alloy of silver and palladium.

3. A semiconductor device comprising:

a lead frame including a plurality of leads;

at least one electronic component mounted on a first of the leads of the lead frame;

a chip resistor comprising:

a resistor body comprising an insulating substrate having first and second opposed major surfaces and side surfaces smaller in area than the first and second major surfaces and joining the first and second major surfaces;

a continuous resistance layer disposed on the first and second major surfaces and on at least one of the side surfaces of the insulating substrate;

a wire-bonding electrode for attachment of a wire by wire bonding, the wire-bonding electrode being disposed on and directly contacting the resistance layer at the first major surface of the insulating substrate; and a soldering electrode for soldering to a metallic body, the soldering electrode being disposed on and directly contacting the resistance layer opposite all of the second major surface of the insulating substrate;

a wire wire-bonded at a first end to the wire bonding electrode and connected at a second end to the electronic component; and solder connecting all of the soldering electrode to a second of the leads of the lead frame.

* * * * *